(12) United States Patent
Costrini et al.

(10) Patent No.: US 6,686,296 B1
(45) Date of Patent: Feb. 3, 2004

(54) NITROGEN-BASED HIGHLY POLYMERIZING PLASMA PROCESS FOR ETCHING OF ORGANIC MATERIALS IN SEMICONDUCTOR MANUFACTURING

(75) Inventors: Gregory Costrini, Hopewell Junction, NY (US); Peter D. Hoh, Hopewell Junction, NY (US); Richard S. Wise, New Windsor, NY (US); Wendy Yan, Somers, NY (US)

(73) Assignee: International Business Machines Corp., Armonk, NY (US)

( * ) Notice: Subject to any disclaimer, the term of this patent is extended or adjusted under 35 U.S.C. 154(b) by 54 days.

(21) Appl. No.: 09/723,529

(22) Filed: Nov. 28, 2000

(51) Int. Cl.[7] ............................................. H01L 21/3065
(52) U.S. Cl. ..................... 438/725; 438/738; 216/49; 216/62; 216/67; 216/72
(58) Field of Search ..................... 216/49, 62, 67, 216/72; 438/710, 725, 738

(56) References Cited

U.S. PATENT DOCUMENTS

| | | | |
|---|---|---|---|
| 4,226,896 A | 10/1980 | Coburn et al. ................ 427/34 |
| 4,372,807 A | 2/1983 | Vossen, Jr. et al. .......... 156/643 |
| 4,526,644 A | 7/1985 | Fujiyama et al. ............ 156/345 |
| 4,797,178 A | 1/1989 | Bui et al. .................... 156/643 |
| 5,284,549 A | 2/1994 | Barnes et al. ............... 156/662 |
| 5,338,399 A | 8/1994 | Yanagida .................... 156/662 |
| 5,770,098 A | 6/1998 | Araki et al. .................. 216/67 |
| 5,779,998 A | 7/1998 | Tom ............................ 423/210 |
| 5,930,644 A | * | 7/1999 | Tsai et al. ................... 438/424 |
| 6,009,830 A | | 1/2000 | Li et al. .................. 118/723 R |
| 6,051,100 A | | 4/2000 | Walko, II .................... 156/345 |
| 6,117,786 A | * | 9/2000 | Khajehnouri et al. ......... 216/17 |
| 6,156,629 A | * | 12/2000 | Tao et al. ..................... 216/37 |
| 6,184,150 B1 | * | 2/2001 | Yang et al. ................. 438/740 |
| 6,228,279 B1 | * | 5/2001 | Armacost et al. ............ 216/47 |
| 6,284,149 B1 | * | 9/2001 | Li et al. ...................... 216/64 |
| 6,337,285 B1 | * | 1/2002 | Ko .............................. 216/67 |
| 6,372,636 B1 | * | 4/2002 | Chooi et al. ................ 438/639 |
| 2001/0034106 A1 | * | 10/2001 | Moise et al. ................ 438/396 |

FOREIGN PATENT DOCUMENTS

| | | |
|---|---|---|
| JP | 11145114 | 5/1999 |
| JP | 11186229 | 7/1999 |
| JP | 11186243 | 7/1999 |
| JP | 11317392 | 11/1999 |
| WO | WOA1 9910923 | 3/1999 |

* cited by examiner

*Primary Examiner*—Allan Olsen
(74) *Attorney, Agent, or Firm*—DeLio & Peterson LLC; Kelly M. Reynolds; Steven Capella

(57) ABSTRACT

A method of etching an organic antireflective film layer underlying a patterned resist layer on a semiconductor substrate by contacting the exposed organic film with a fluorocarbon and nitrogen etchant in the presence of a plasma-generated energy and removing exposed areas of the organic film with the etchant. An oxide layer underlying the organic film layer is substantially undamaged after contact with the etchant. The plasma is a high density plasma and preferably contains argon, $C_4F_8$, and nitrogen.

23 Claims, 1 Drawing Sheet

NITROGEN-BASED HIGHLY POLYMERIZING PLASMA PROCESS FOR ETCHING OF ORGANIC MATERIALS IN SEMICONDUCTOR MANUFACTURING

BACKGROUND OF THE INVENTION

1. Field of the Invention

The present invention relates to manufacturing of integrated circuits on semiconductor substrates and, in particular, to etching of organic films on such semiconductor substrates.

2. Description of Related Art

In lithographic processing of semiconductor wafer substrates, a photoresist layer is deposited and patterned by selective exposure to an energy beam, developing and etching to form patterned exposed area, which are then used to selectively etch underlying layers. The extension of 248 nm lithography has in many cases led to the introduction of more sensitive photoresists. Many of these photoresists have demonstrated poor performance with traditional etch processes. Deep ultraviolet (DUV) photoresists have demonstrated increased sensitivity to etch processes for the underlying layers. This has been an important issue with regard to etching of underlying organic coatings, particularly organic anti-reflective coatings (ARC), which are in turn applied over dielectric layers. Opening to an organic ARC (anti-reflective coating) layer is often the most challenging step in which to maintain photoresist integrity.

High density plasma (HDP) etching tools, when applied to organic ARC etching, have suffered from poor DUV photoresist protection due to their aggressiveness, e.g., high ion flux and high dissociation fraction. This has made implementation of the HDP sources for dielectric etching difficult.

The photoresist damage is typically addressed by the application of a less aggressive etch process, i.e. lower power and less reactant flow. As a result, very mild etching conditions have typically been necessary for etching the organic layer to avoid damage to the overlying photoresist layer. Organic ARC is, from an etch perspective, similar to photoresist, and the ARC etch will typically strongly impact the photoresist as well. For this reason, the ARC open for sensitive photoresists has been performed in a traditional low power plasma etch tool to minimize damage, presumably by limiting the etch rate and reactant flow. However, much of the throughput advantage of a high density plasma tool is lost when a conventional tool must be used to open the ARC layer, as it in turn leads to a loss of etch rate and possibly a reduction of anisotropy.

Bearing in mind the problems and deficiencies of the prior art, it is therefore an object of the present invention to provide an improved method of etching of organic layers, especially organic ARCs, selective to patterned photoresist layers.

It is another object of the present invention to provide a method of etching organic layers on a semiconductor wafer substrate which has higher etch rates without damage to the photoresist layer.

A further object of the invention is to provide a method of increasing organic layer etch throughput using available etching equipment.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method of etching an organic film layer underlying a patterned resist layer on a semiconductor substrate. The method comprises providing a substrate having an organic film layer and a patterned resist layer overlying the organic film layer. The patterned resist layer has spaces exposing areas of the organic film layer. The organic film layer and the resist layer being of differing composition from each other. The method includes contacting the exposed organic film with an etchant comprising a fluorocarbon and nitrogen in the presence of a plasma-generated energy and removing exposed areas of the organic film with the etchant.

Preferably, the plasma is a high density plasma and, during the plasma etching, there is applied a plasma source power of about 300 to 2500 watts and a bias power applied to the wafer of about 100 to 1000 watts, at an operating pressure of about 2 to 20 mTorr. The etchant preferably comprises about 50 to 95 volume percent argon, about 5 to 40 volume percent $C_4F_8$, and about 5 to 60 volume percent nitrogen. More preferably, the fluorocarbon is $C_4F_8$, and the etchant further includes a noble gas, for example, argon.

The method is particularly useful where the organic film is an organic antireflective coating, and the resist layer comprises a deep ultraviolet resist material. The patterned resist layer is consumed more slowly than the organic film layer, and the etchant removes substantially all of the organic film in the area contacted by the etchant. The substrate may include an oxide layer underlying the organic film layer, such that the etchant removes substantially all of the organic film in the area contacted by the etchant and exposes an area of the oxide layer, and the oxide layer is substantially undamaged after contact with the etchant.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
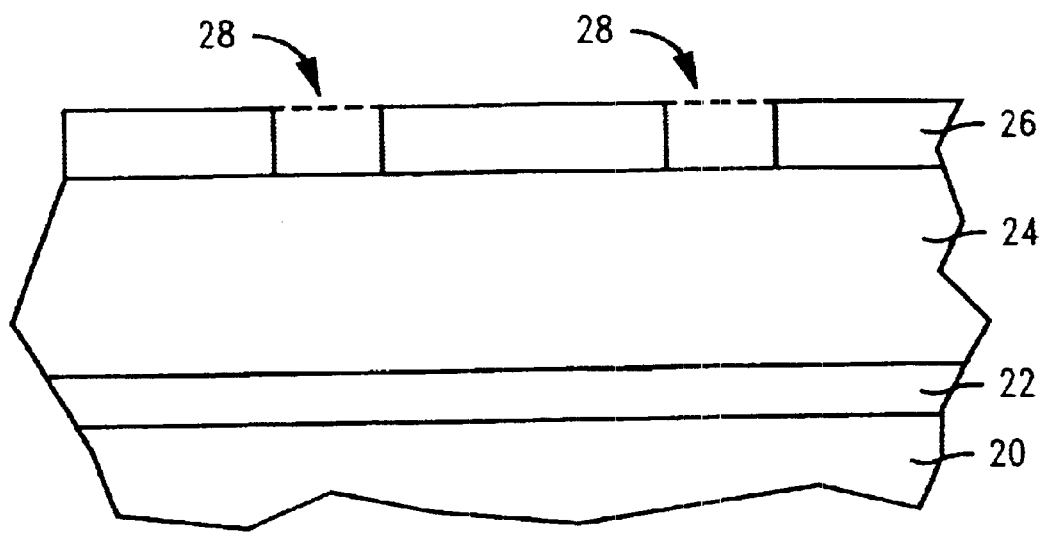
FIG. 1 is a side elevational view of a cross-section of a substrate having successive oxide, organic and patterned resist layers.

In describing the preferred embodiment of the present invention, reference will be made herein to FIGS. 1 and 2 of the drawings in which like numerals refer to like features of the invention. Features of the invention are not necessarily shown to scale in the drawings.

The present invention, in its preferred embodiment, provides an application of an $N_2$ based highly polymerizing plasma process to be used for low damage etching of organic materials used in semiconductor manufacturing. The present invention utilizes the $N_2$ addition to form a protective polymer to facilitate ARC etching without undue photoresist damage, even at the higher plasma energy levels.

Despite the problems encountered in etching organic layers in the prior art, the present invention preferably employs a high density plasma during etching to improve throughput and CD control. Such a high density plasma source provides a much higher etch rate than traditional, diode type reactors. The plasma electrons are excited in a direction parallel to the reactor boundaries. This allows the operating pressure to be reduced to a point where the electron mean free path is much larger than the physical size of the reactor. In order to be self-sustaining, the plasma attains a higher electron and reactive neutral density to compensate for greater diffusive losses.

Although previous state of the art high density plasma ARC open processes have relied on oxidant addition to combust the organic material, the present invention has avoided this approach. For example, applicants have found that mixtures of He and $O_2$ using very low powers, e.g., 150 watts bias or less, have shown some promise for less sensitive photoresists, such as APEX-E. Similarly mixtures of Ar and $CO_2$ using low bias powers, have also been found to perform adequately on these resists. However, both mixtures have shown an unsatisfactory degree of microfissures on more sensitive photoresists, such as Ultraviolet II High Speed (UVIIHS) and Japan Synthetic Rubber (JSR). In addition applicants have found that, with more sensitive photoresists the photoresist can be laterally attacked by oxidants, leading to loss of critical dimension (CD) control.

Recently, applicants have also been able to demonstrate a low damage ARC etch process which uses a combination of polymer, hydrogen addition, and a reasonably high bias power, e.g., 600 watts. This process has been found not to damage the photoresist severely as with the oxidant addition, and has been used in dynamic random access memory (DRAM) development. This process does suffer, however, from poor CD performance, in that there has been found to result a substantial degree of taper in the ARC and in the remaining photoresist following the ARC open, and subsequent bowing in the underlying oxide layer.

In order to avoid a heavy sidewall deposition of polymer and subsequent CD loss and bowing of the oxide profile, the present invention provides an alternative process with similar levels of resist damage and similar selectivity to patterned resist (PR) layers, but with higher sputter component. This process may be employed with JSR resists, as well as for UVIIHS resists. By utilizing a highly polymerizing fluorocarbon base chemistry, for example $C_4F_8$, with a $N_2$ addition for a high sputter yield of the polymer even at lower bias powers, the photoresist is protected without utilizing a high, and often damaging, DC bias.

In FIG. 1, there is shown a substrate 20 having applied and deposited thereover an oxide layer 22, for example, silicon dioxide, and, in contact with the silicon dioxide layer, a subsequent layer of an organic film 24. The oxide layer is a patterned layer, as opposed to an etch stop layer. The organic film contains carbon and may be any organic film used in semiconductor manufacturing by lithographic processes, for example, bottom layer anti-reflective coating (BARL), Silicon Low K (SiLK), or Anti-reflective 3 (AR-3). The present invention is particularly useful in connection with ARC organic films. These ARC organic films generally are made up of organic aromatics without photoactive acids, and are used to minimize interference reflections beneath the PR.

In addition to etching of ARC materials, using a low ionization threshold species with a highly polymerizing species for other organic material etching is also possible.

The addition of $N_2$ to a high density fluorocarbon system provides a higher level of molecular ionization (due to the low ionization threshold of $N_2$), as well as a high level of high temperature neutral species. The latter results from the vibrational excitations of the $N_2$ molecule. These effects both act to enhance the surface removal rate of polymer at low DC bias, which effects improved CD control without sacrificing PR integrity.

Above and in contact with organic film layer 24 is photoresist layer 26. Photoresist layer 26 is of a different composition than organic film layer 24, and typically comprises organic aromatics or aliphatics with a photoactive acid component. The resist layer may be selectively exposed by an energy beam passing through a mask having the desired image pattern, developed, and etched by conventional methods to create openings or spaces 28 extending completely through the resist layer and exposing the upper surface of the organic film layer 24. These openings or spaces 28 are then used as a pattern to etch the underlying organic layer. The etching of the organic film layer in accordance with the present invention is preferably performed in an otherwise conventional high density plasma etching chamber, for example, the IPS System available from Applied Materials Corporation of Santa Clara, Calif. Such etching is preferably performed under high density plasma conditions, which are generally understood to be under an ion/neutral ratio greater than $10^{-4}$. The difference between etching with a decoupled, high density plasma source and etching with a capacitively coupled, low density plasma source is that the key plasma-to-radical density for the former is typically about two orders of magnitude (100×) greater than the latter.

In general, the preferred etchant is a gaseous mixture containing from about 50 volume percent to about 95 volume percent Ar, about 5 volume percent to about 40 volume percent fluorocarbon, e.g., $C_4F_8$, with the balance being $N_2$ in an amount of about 5 volume percent to about 60 volume percent (all volume percents being of the total gaseous etchant mixture). More preferably, the etchant contains about 30 to 50 volume percent nitrogen. The operating pressure in the plasma chamber preferably ranges from 2 mTorr to about 20 mTorr, and the plasma generation, or source, power in the system preferably ranges from about 300 to about 2500 watts. The bias power, applied to the wafer substrate, preferably ranges from about 100 to about 1000 watts.

Figure 2:
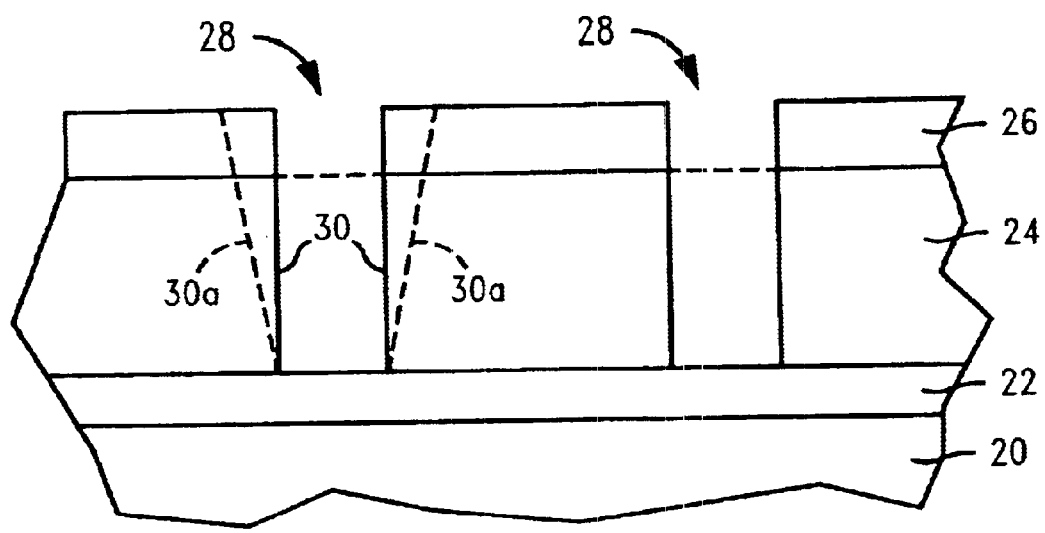
FIG. 2 is a side elevational view of the cross-section of FIG. 1 after etching the organic layer with the preferred etchant of the present invention.

The etching of the organic film layer is shown in FIG. 2. The gaseous fluorocarbon/nitrogen etchant is applied using a high density plasma source as described above and removes the portions of organic film layer under openings 28. During etching of the organic film layer, the patterned resist layer is eroded or consumed more slowly than the organic layer. The walls 30 of the organic layer opening (either trench or vias) are substantially vertical, with minimal taper. Such wall taper, shown exaggerated as phantom lines 30a, is a significant problem in prior art methods, and has been shown to be substantially reduced after employing the etch process of the present invention. Tests have shown that the difference in opening width, or CD bias, is as low as 10 nm, as measured from top to bottom of an organic ARC film layer of 90 nm thickness. Moreover, the prior art has also shown excessive bowing of the underlying oxide layer 22. Applicants' tests have shown no image integrity penalty incurred with the $N_2$ additive process of the present invention, and the oxide bowing performance is substantially improved. The present invention is able to prevent damage to the underlying silicon dioxide layer.

Due to a fluorocarbon base chemistry, the preferred fluorocarbon/nitrogen ($C_4F_8/N_2$) process of the present invention has also been employed in applications where there is a need to etch silicon-based dielectric layers, e.g., $SiO_2/Si_3N_4$, with little selectively to organic materials. A key application with this requirement is in dual damascene processing. Dielectric etch processes with too high a selectively to organic materials result in fence formation due to micromasking by residual resist and ARC. To minimize fence formation, i.e., the formation of semi-organic residues inside the etched opening, a process with low anisotropic selectively to organic materials is ideal. Simple addition of $O_2$ leads to isotropic loss if organic materials, which reduces the fencing but incurs a penalty in critical dimension. In contrast, the process of the present invention leads only to anisotropic loss of organic material, with a substantial, e.g., 50%, reduction in fence formation and no CD penalty. In particular, the anisotropic nature of the organic etch rate has been shown to provide a slight negative etch bias.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of etching an organic film layer underlying a patterned resist layer on a semiconductor substrate, the method comprising:
   providing a substrate having an organic film layer and a patterned resist layer overlying said organic film layer, the patterned resist layer having spaces exposing areas of the organic film layer, the organic film layer and the resist layer being of differing composition from each other;
   contacting the exposed organic film with an etchant comprising $C_4F_8$ and nitrogen and absent an oxidant addition, said etchant in the presence of a high density plasma-generated energy; and
   removing exposed areas of the organic film with the etchant wherein a layer underlying said organic film is substantially undamaged after contact with said etchant.

2. The method of claim 1 wherein, during the plasma etching, there is applied a plasma source power of about 300 to 2500 watts and a bias power applied to the wafer of about 100 to 1000 watts, at an operating pressure of about 2 to 20 mTorr.

3. The method of claim 1 wherein the organic film is an organic antireflective coating.

4. The method of claim 1 wherein the patterned resist layer is consumed more slowly than the organic film layer.

5. The method of claim 1 wherein said etchant further includes a noble gas.

6. The method of claim 1 wherein said etchant further includes argon.

7. The method of claim 1 wherein the etchant removes substantially all of the organic film in the area contacted by the etchant.

8. The method of claim 1 wherein the resist layer comprises a deep ultraviolet resist material.

9. A method of etching an organic film layer underlying a patterned resist layer on a semiconductor substrate, the method comprising:
   providing a substrate;
   depositing on the substrate an organic film layer;
   depositing on the organic film layer a resist layer, the resist layer and the organic film layer being of differing composition from each other;
   patterning the resist layer and creating spaces exposing areas of the organic film layer;
   contacting the exposed organic film with an etchant comprising $C_4F_8$, a noble gas and nitrogen and absent an oxidant addition, said etchant in the presence of high density plasma-generated energy; and
   removing exposed areas of the organic film with the etchant wherein a layer underlying said organic film is substantially undamaged after contact with said etchant.

10. The method of claim 9 wherein the organic film is an organic antireflective coating.

11. The method of claim 9 wherein the patterned resist layer is consumed more slowly than the organic film layer.

12. The method of claim 9 wherein the noble gas comprises argon.

13. A method of etching an organic film layer underlying a patterned resist layer on a semiconductor substrate, the method comprising:
   providing a substrate;
   depositing on the substrate an organic film layer;
   depositing on the organic film layer a resist layer, the resist layer and the organic film layer being of differing composition from each other;
   patterning the resist layer and creating spaces exposing areas of the organic film layer;
   contacting the exposed organic film with an etchant comprising about 50 to 95 volume percent argon, about 5 to 40 volume percent $C_4F_8$, and the balance nitrogen in the presence of high density plasma-generated energy; and
   removing exposed areas of the organic film with the etchant.

14. The method of claim 13 wherein, during the plasma etching, there is applied a plasma source power of about 300 to 2500 watts and a bias power applied to the wafer of about 100 to 1000 watts, at an operating pressure of about 2 to 20 mTorr.

15. The method of claim 13 wherein the etchant removes substantially all of the organic film in the area contacted by the etchant.

16. The method of claim 13 wherein the resist layer comprises a deep ultraviolet resist material.

17. A method of etching an organic film layer underlying a patterned resist layer on a semiconductor substrate, the method comprising:
   providing a substrate having, in sequence, an oxide layer, organic film layer and a patterned resist layer overlying said organic film layer, the patterned resist layer having spaces exposing areas of the organic film layer, the organic film layer and the resist layer being of differing composition from each other;
   contacting the exposed organic film with an etchant comprising a fluorocarbon and nitrogen in the presence of a plasma-generated energy; and
   removing exposed areas of the organic film with the etchant;
   wherein the etchant removes substantially all of the organic film in the area contacted by the etchant and exposes an area of the oxide layer, and wherein the oxide layer is substantially undamaged after contact with the etchant.

18. The method of claim 17 wherein, during the plasma etching, there is applied a plasma source power of about 300 to 2500 watts and a bias power applied to the wafer of about 100 to 1000 watts, at an operating pressure of about 2 to 20 mTorr.

19. The method of claim 17 herein the organic film is an organic antireflective coating.

20. The method of claim 17 wherein the patterned resist layer is consumed more slowly than the organic film layer.

21. The method of claim 17 wherein the plasma is a high density plasma.

22. A method of etching an organic film layer underlying a patterned resist layer on a semiconductor substrate, the method comprising:

provinding a substrate having an oxide layer deposited therein;

depositing on the oxide layer an organic film layer;

depositing on the organic film layer a resist layer, the resist layer and the organic film layer being of differing composition from each other;

patterning the resist layer and creating spaces exposing areas of the organic film layer;

contacting the exposed organic film with an etchant comprising a fluorocarbon, a noble gas and nitrogen in the presence of high density plasma-generated energy; and removing exposed areas of the organic film with the etchant;

wherein the etchant removes substantially all of the organic film in the area contacted by the etchant and exposes an area of the oxide layer, and the oxide layer is substantially undamaged after contact with the etchant.

23. A method of etching an organic film layer underlying a patterned resist layer on a semiconductor substrate, the method comprising:

providing a substrate having an organic film layer and a patterned resist layer overlying said organic film layer, the patterned resist layer having spaces exposing areas of the organic film layer, the organic film layer and the resist layer being of differing composition from each other;

contacting the exposed organic film with an etchant comprising about 50 to 95 volume percent argon, about 5 to 40 volume percent $C_4F_8$, and the balance nitrogen in the presence of a plasma-generated energy; and removing exposed areas of the organic film with the etchant.

* * * * *